United States Patent
Geng et al.

(10) Patent No.: US 12,309,933 B2
(45) Date of Patent: May 20, 2025

(54) MAGNETICALLY SECURED SEMICONDUCTOR CHIP PACKAGE LOADING ASSEMBLY

(71) Applicant: Intel Corporation, Santa Clara, CA (US)

(72) Inventors: Phil Geng, Washougal, WA (US); Timothy Glen Hanna, Tigard, OR (US); Xiaoning Ye, Portland, OR (US); Sandeep Ahuja, Portland, OR (US); Jacob McMillian, Beaverton, OR (US); Ralph V. Miele, Hillsboro, OR (US); David Shia, Portland, OR (US); Jeffory L. Smalley, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 761 days.

(21) Appl. No.: 17/381,092

(22) Filed: Jul. 20, 2021

(65) Prior Publication Data

US 2021/0378099 A1    Dec. 2, 2021

(51) Int. Cl.
| | |
|---|---|
| *H05K 1/00* | (2006.01) |
| *H01L 23/367* | (2006.01) |
| *H01L 23/40* | (2006.01) |
| *H05K 1/02* | (2006.01) |
| *H05K 1/18* | (2006.01) |
| *H05K 7/20* | (2006.01) |

(52) U.S. Cl.
CPC ......... *H05K 1/181* (2013.01); *H01L 23/3675* (2013.01); *H01L 23/40* (2013.01); *H05K 1/0203* (2013.01); *H05K 7/2039* (2013.01); *H05K 2201/08* (2013.01)

(58) Field of Classification Search
CPC .... H05K 1/181; H05K 1/0203; H05K 7/2039; H05K 2201/08; H01L 23/3675; H01L 23/40
USPC ............................................ 361/709
See application file for complete search history.

(56) References Cited

U.S. PATENT DOCUMENTS

| | | | |
|---|---|---|---|
| 2008/0315386 A1* | 12/2008 | Kudo ............... | H01L 25/105 |
| | | | 257/E23.079 |
| 2014/0153265 A1* | 6/2014 | Rudisill ............. | F21V 21/35 |
| | | | 362/398 |
| 2018/0190634 A1* | 7/2018 | Aoki ................. | H05K 3/341 |
| 2019/0115281 A1* | 4/2019 | Lee .................. | H01L 23/427 |
| 2021/0043537 A1 | 2/2021 | Faneuf et al. | |

OTHER PUBLICATIONS

Prior Art.

* cited by examiner

*Primary Examiner* — Zhengfu J Feng
(74) *Attorney, Agent, or Firm* — Compass IP Law PC

(57) ABSTRACT

An apparatus is described. The apparatus includes a semiconductor chip package loading assembly having a heat sink and a first magnetic material, the first magnetic material to be mechanically coupled to a first side of a printed circuit board that is opposite a second side of the printed circuit board where input/outputs (I/Os) of the semiconductor chip package interface with the printed circuit board. The first magnetic material to be positioned between the printed circuit board and a second magnetic material. The first magnetic material is to be magnetically attracted to the second magnetic material to impede movement of the heat sink.

20 Claims, 10 Drawing Sheets

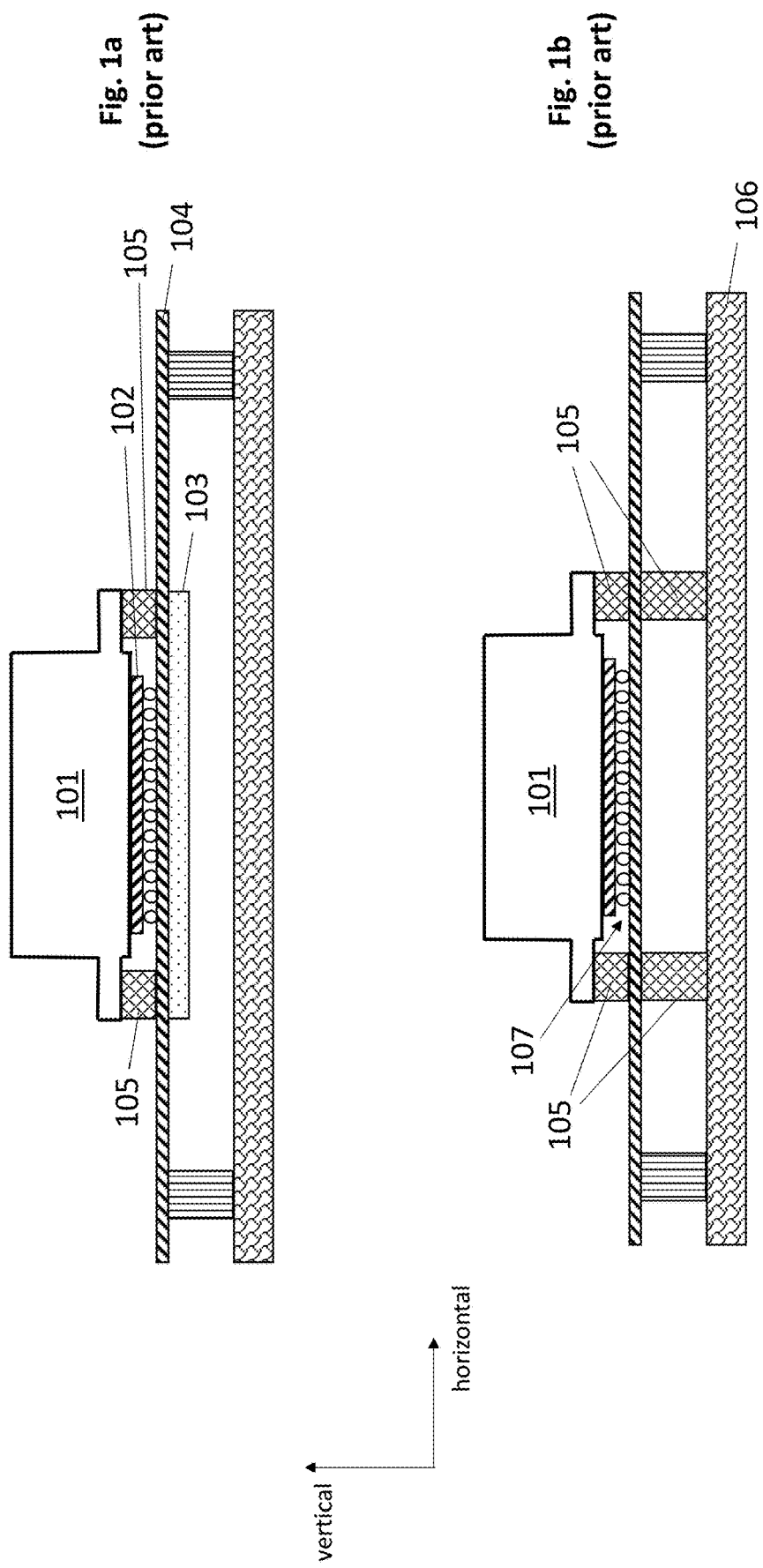

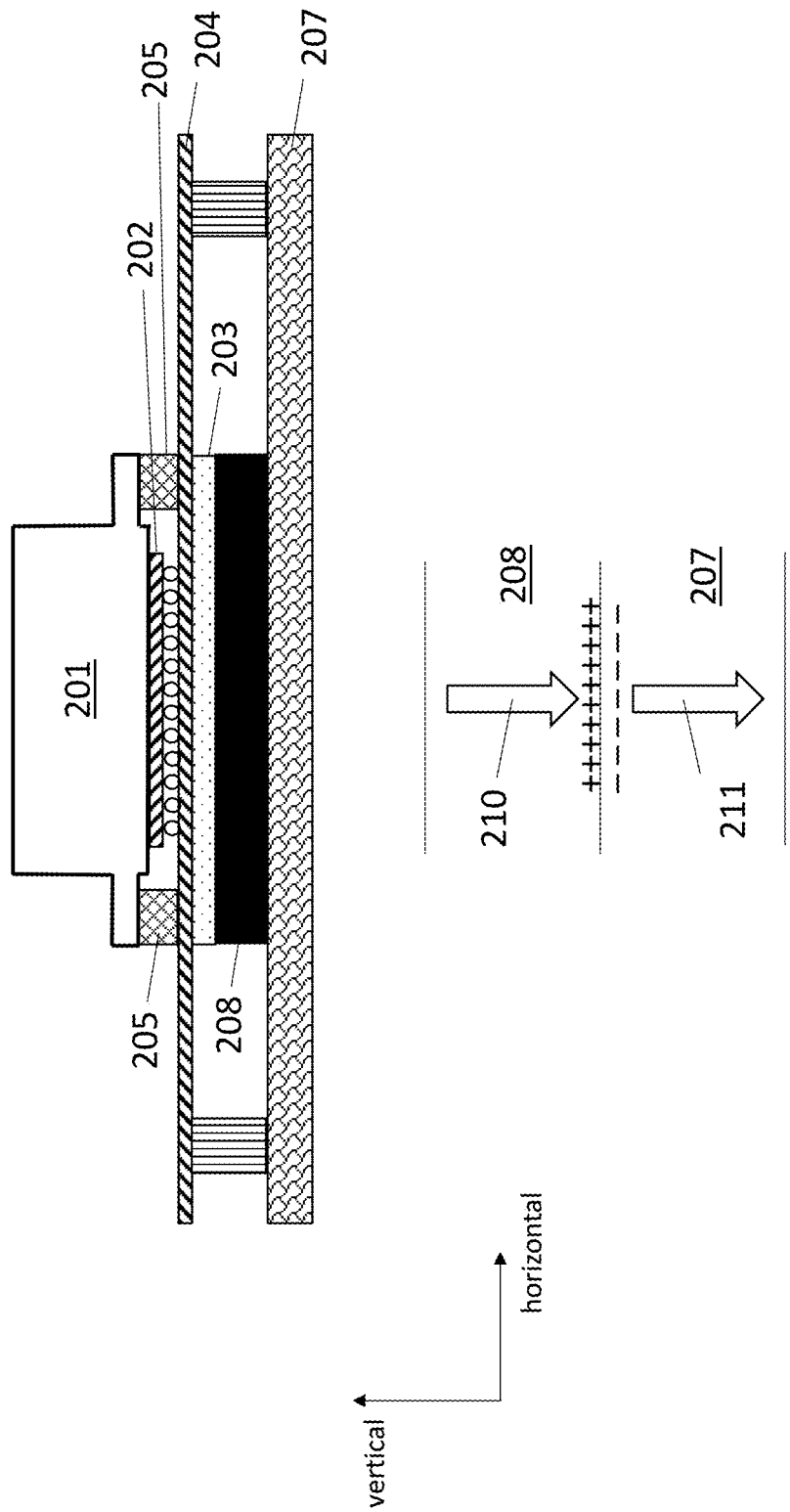

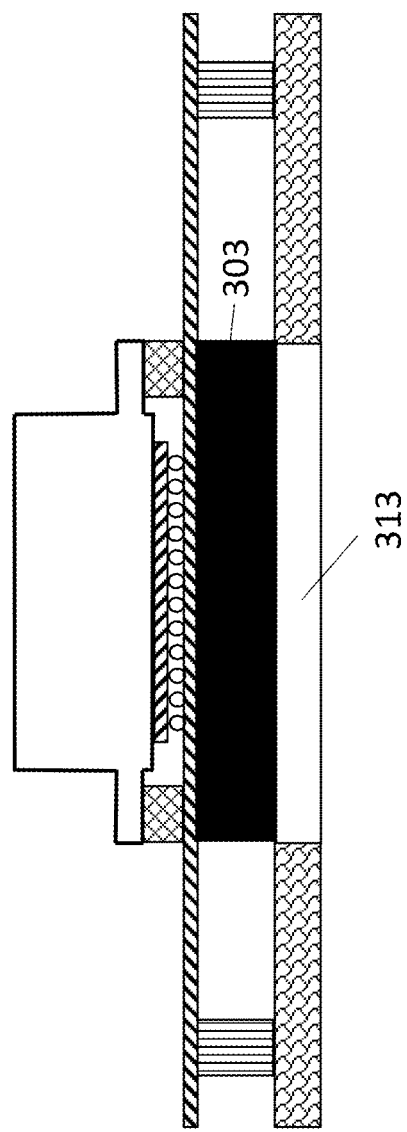

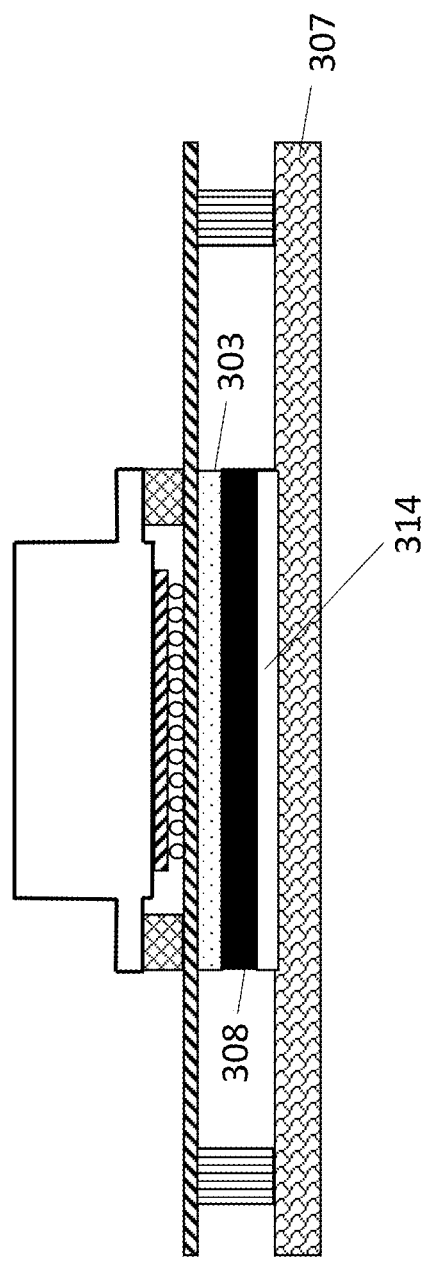

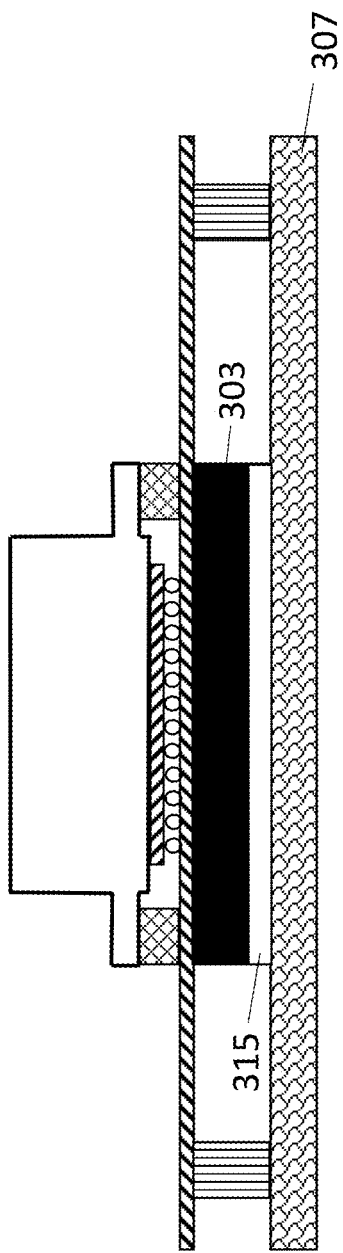

MAGNETICALLY SECURED SEMICONDUCTOR CHIP PACKAGE LOADING ASSEMBLY

BACKGROUND

The heat dissipation and number of input/outputs ("I/Os") of leading edge semiconductor chips is continually increasing as a consequence of their continuous increase in performance and/or functionality. The packaging of such chips is becoming more and more challenging.

FIGURES

Figure 4:
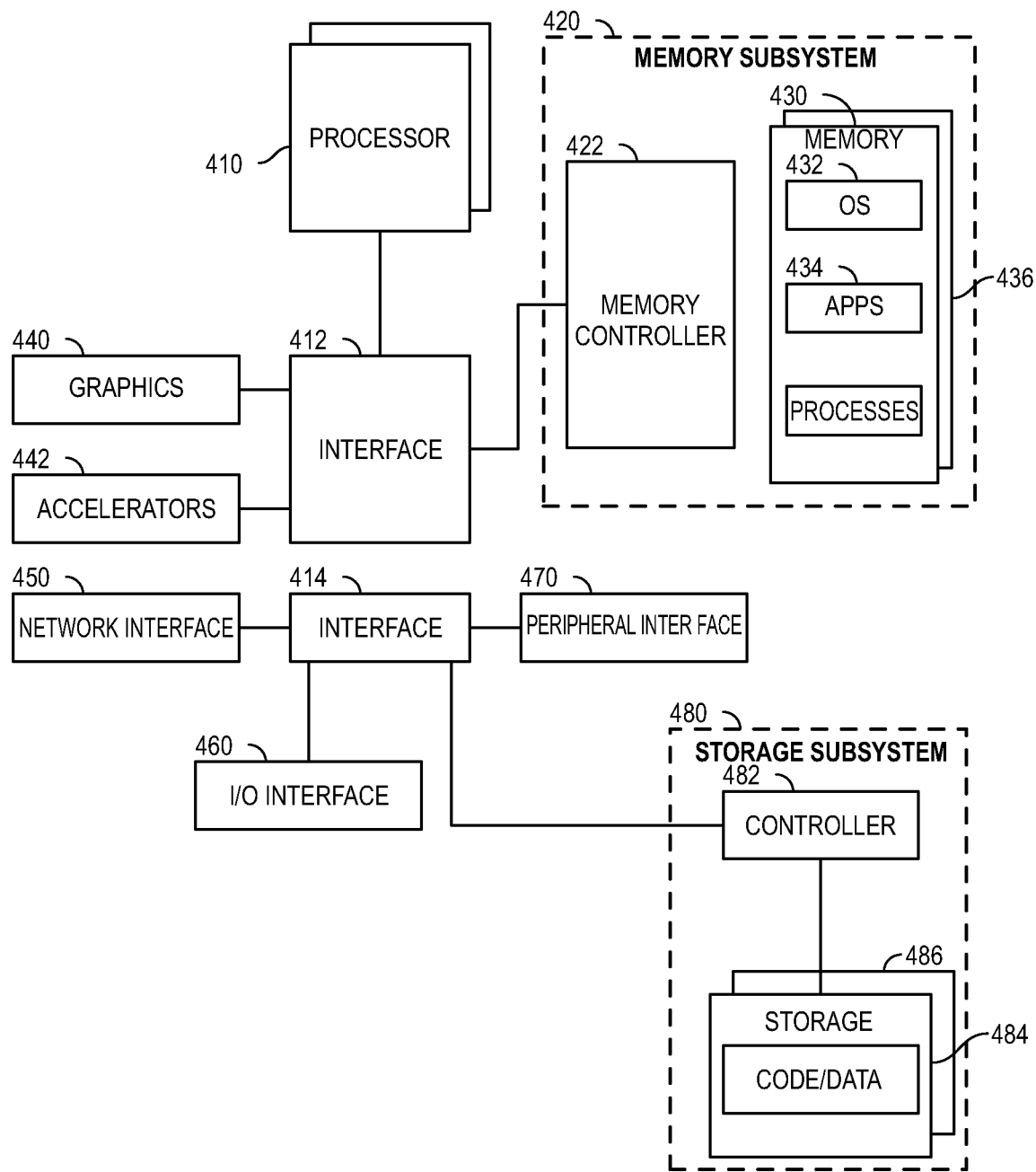
Figure 5:
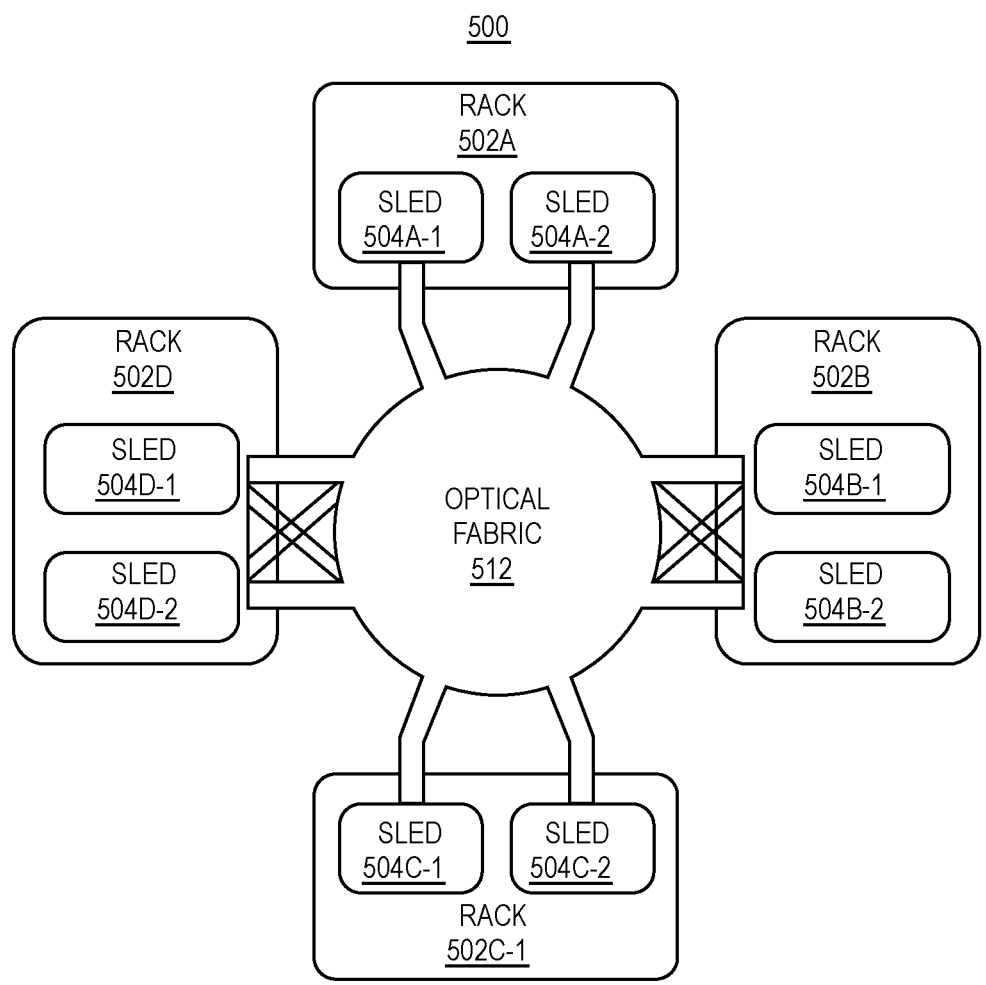
Figure 6:
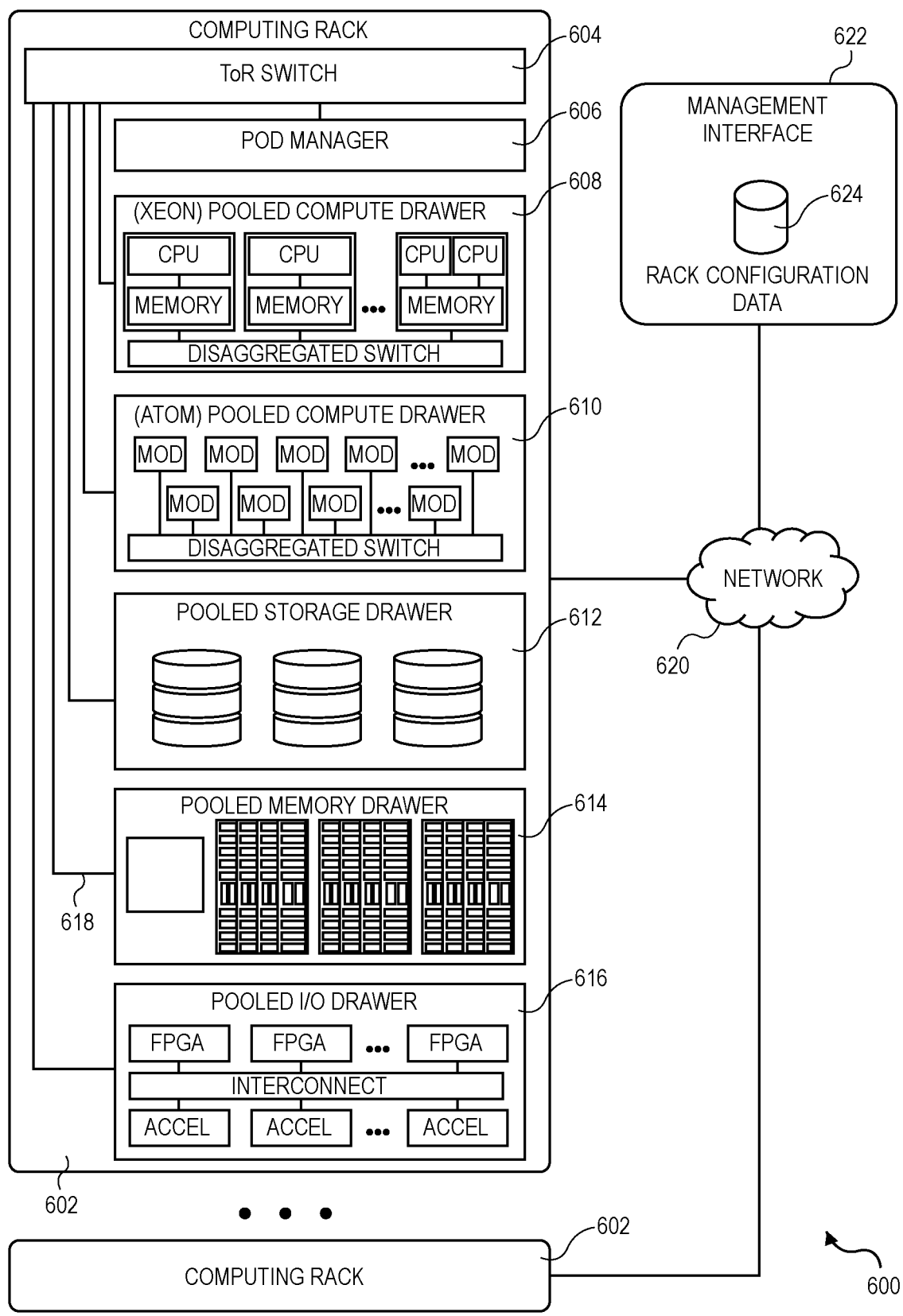

A better understanding of the present invention can be obtained from the following detailed description in conjunction with the following drawings, in which:

FIG. 1a shows a first loading assembly (prior art);
FIG. 1b shows a second loading assembly (prior art);
FIG. 2 shows an improved loading assembly;
FIGS. 3a, 3b, 3c, 3d and 3e show alternative improved loading assemblies;
FIG. 4 shows a system;
FIG. 5 shows a data center;
FIG. 6 shows a rack.

DETAILED DESCRIPTION

FIGS. 1a and 1b depict two different prior art heat sink loading assemblies. A heat sink loading assembly aims to: 1) secure a heat sink 101 in position so that its movement is minimal (even in response to a physical force/shock); 2) receive most/all of the weight ("load") of the heat sink 101 so that the semiconductor chip package 102 that the heat sink 101 is in thermal contact with receives little/none of the weight.

As observed in FIG. 1a, a first approach applies a back plate 103 to the back of the printed circuit board (PCB) 104 that the semiconductor chip package 102 is in electrical/mechanical contact with. A loading frame 105 (also referred to as a "bolster plate", "bolster frame", "loading plate" and the like) is secured to the back plate (e.g., with bolts threaded into mounts that run through holes in the PCB). The heat sink 101 is securely mounted to the loading frame 105. The shapes and dimensions of the loading frame 105 and heat sink 101 are designed so that the bottom face of the heat sink only modestly presses into the top/lid of the semiconductor chip package 102 (also referred to as an integrated heat spreader (IHS)).

Here, the loading frame 105 and back plate 103 are supposed to receive most/all of the weight of the heat sink 101 and keep the heat sink 101 fixed in place. However, with increasing heat sink mass, there is more propensity for the PCB 104 to bend or sag under the weight of the heat sink 101 in the region of the chip package 102.

As observed in FIG. 1b, a second approach also uses a loading frame 105 for the reasons specified above with respect to FIG. 1a. However, the loading frame 105 is mounted directly to the system chassis 106 rather than to a backing plate on the backside of the PCB. Mounting the loading frame 101 to the system chassis 106 causes the system chassis 106 to receive the weight of the heat sink rather than the PCB 104 (as in the approach of FIG. 1a).

In operation, one or more semiconductor chips within the package 102 dissipate heat with warms the package IHS. The heat sink 101 draws heat away from the package IHS. The absorbed heat is then radiated away from the heat sink 101 (e.g., with cool air that blows across "fins" that are formed in the heat sink 101). In order to draw heat from the package 102, the heat sink 101 is placed in thermal contact with the chip's package (typically by being placed directly on the package lid as mentioned above).

Heat sink mass is therefore increasing in order to meet the cooling requirements of leading edge semiconductor chips commensurate with their increase in heat dissipation. That is, the more heat that is generated by the semiconductor chip(s) within the package 102, the greater the mass needed for the corresponding heat sink 101 (in order to absorb more heat, more heat sink mass is needed).

With chip I/Os increasing, the I/Os at the package/PCB interface 107 are becoming smaller which, in turn, poses a greater potential for I/O damage resulting from heat sink movement. That is, with smaller I/Os at the package/PCB interface 107, there is less tolerance for movement of the package 102 relative to the PCB 104 as a consequence of movement of the heat sink 101.

Unfortunately, a higher mass heat sink 101 has a propensity to continue moving once it begins moving (a higher mass heat sink will have more momentum than a lower mass heat sink). In short, with increasing chip heat dissipation and performance, the heat sink 101 is becoming more difficult to keep fixed in place while, at the same time, the I/Os at the package/PCB interface 107 are becoming more sensitive to heat sink movement.

In general, from a packaging perspective, movement of the heat sink along the horizontal axis is easier to prevent than movement along the vertical axis. That is, frames and other fixtures of the loading assembly can be designed that keep movement of the heat sink along the plane of the PCB within acceptable limits.

However, vertical movement of the heat sink 101 is more difficult to prevent. Here, if the system chassis 106 were to receive a sudden physical shock (which can arise, e.g., while the system is being installed into a rack, is accidently dropped, etc.), the more stable approach of FIG. 1b has difficulty preventing vertical movement of the heat sink—particularly with heavier (higher mass) heat sinks that are expected to be used for future generation, high performance semiconductor chips.

FIG. 2 therefore shows an improved approach that additionally introduces magnetic forces to prevent movement of the heat sink along the vertical axis. In particular, as observed in FIG. 2, the loading assembly includes a backplate 203 having a magnetic layer 208 facing the system chassis 207. The system chassis 207 is comprised of magnetic material at least in the region that faces the backplate's magnetic layer 208. A loading frame 205 is mounted to the backplate 203 and the heat sink 201 is mounted to the loading frame 205. The loading frame 205 and backplate 203 bear most/all of the weight of the heat sink 201 so that the chip package 202 does not have to. The magnetic layer 208 is composed of magnetic material. A magnetic material is a material that is capable of being magnetized (forming a magnetic moment).

As described in more detail below, the backplate magnetic layer 208 and the magnetic material in the chassis 207 create an attractive force between these two elements 207, 208 that eliminates or at least reduces vertical movement of the heat sink 201 so that the I/Os between the package 202 and PCB 204 are not damaged (e.g., in response to a physical shock applied to the system).

According to one approach, the magnetic layer 208 is permanently magnetized along the vertical axis which induces magnetic poles of a particular polarity (positive or negative) on the surface of the magnetic layer 208 that faces the system chassis 207 (a "downward" magnetization direction 210 results in positive magnetic poles as observed in FIG. 2).

The magnetic poles on the backplate's magnetic layer 208 induce magnetic poles of opposite polarity on the surface of the system chassis 207 that faces the backplate magnetic layer 208. Alternatively, the region of the chassis 207 that faces the backplate's magnetic layer 208 is permanently magnetized where the direction of magnetization 211 is the same as within the backplate's magnetic layer 208 such that magnetic poles of opposite polarity are present on the side of the chassis 207 that faces the backplate 208 (alternatively still, the magnetic region of the chassis 207 can have a permanent vertical magnetic moment 211 that induces poles of opposite polarity on the surface of the backplate's magnetic material 208 that faces the chassis 207).

The presence of magnetic poles of opposite polarity facing each other results in a magnetic field between the backplate magnetic layer 208 and chassis 207 that essentially attracts the backplate magnetic layer 208 and chassis 207 toward one another. With the backplate magnetic layer 208 being a component of, or hard fixed to or otherwise mechanically integrated with the backplate 203, the magnetic attraction essentially acts as a force that inhibits vertical movement of the backplate 203 and the heat sink 201 that is mounted to it.

That is, for example, if the system is subjected to a physical shock that would otherwise induce the heat sink 201 to move in a vertical direction, the attractive magnetic force between the backplate 203/208 and chassis 207 prevents such movement (or otherwise reduces it so that the I/Os between the package 202 and PCB 204 are not damaged).

Here, the strength of the magnetic field is a function of the magnetic pole density on the respective surfaces of the backplate/chassis interface 208/207. As is known in the art, the greater the magnetization within a magnetic material, the greater the magnetic pole density on the material's surface. The magnitude of the magnetization 210, 211 within the backplate and chassis elements can therefore be determined from the desired magnetic field strength needed to sufficiently thwart vertical movement of the backplate 201.

Here, generally speaking, the greater the mass of the heat sink 201, the greater the magnetization 210, 211 needed within the magnetic elements of the backplate and the chassis (the greater the magnetization 210, 211 within the magnetic elements, the greater the attractive force between them).

At one extreme, the respective magnetic materials on both sides of the interface 208/207 have sufficiently high concentrations of one or more of Iron (Fe), Cobalt (Co) and Nickel (Ni) to create sufficiently high magnetizations 210, 211 (Fe, Co and Ni are particularly magnetic). Generally, steel is a metallic alloy composed of Fe and approximately 1% of Carbon (C) (and, commonly, other metals (e.g., Chromium (Cr))). As such, steel, which is commonly used for the chassis 207 material, is believed to be capable of creating sufficiently high internal magnetizations 211 for various large mass heat sinks (e.g., 800-1500 grams).

Additionally, at least one of the magnetic materials at the interface 208/207 should have a magneto-crystalline anisotropy (hereinafter, "anisotropy") that causes its magnetization 210, 211 to be oriented along the vertical axis rather than the planar axis. Here, without such anisotropy, the planar shape of the backplate 208 and chassis 207 would cause their respective internal magnetization directions to lie in their respective planes (to minimize internal magnetic field energy). Anisotropy introduces a lattice component to the internal energy equation that, if strong enough, will cause the magnetization to be oriented along a direction preferred by the lattice (which in the case of the teachings of the instant application should be along the vertical axis).

Thus, apart from sufficient concentrations of magnetic materials (e.g., Fe, Co, Ni), the magnetic materials at the interface 208/207 should be composed of materials whose lattice arrangement of atoms (phase) induces a strong anisotropy that orients the magnetization along the vertical axis rather than along the planar axis.

Finally, the coercivity of at least one of the magnetic materials at the interface 208/207 needs to be high enough to prevent the magnetization direction from "flipping" (e.g., in response to an externally applied magnetic field). Coercivity is the external magnetic field strength needed to flip the magnetization direction and can be related to a magnetic material's anisotropy (the stronger the anisotropy, the more difficult it will be to flip the magnetic element's magnetization direction). Coercivity essentially determines whether or not a magnet is a permanent magnetic. That is, a magnetic material having a high coercivity will greatly resist a flip or change in its magnetization direction which, in turn, corresponds to the magnet material behaving like a permanent magnet.

Thus, to reiterate, in various embodiments, one or both of the backplate and chassis magnetic elements 208, 207 are permanent magnetics with magnetization direction oriented along the vertical axis.

Figure 3A:
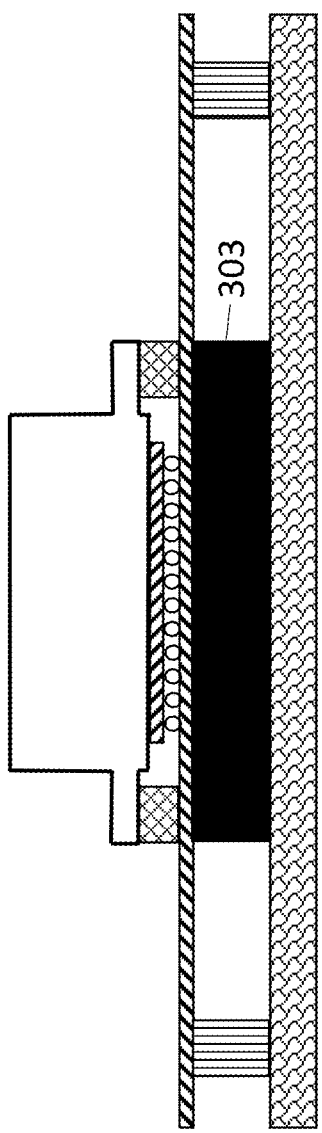
Figure 3B:
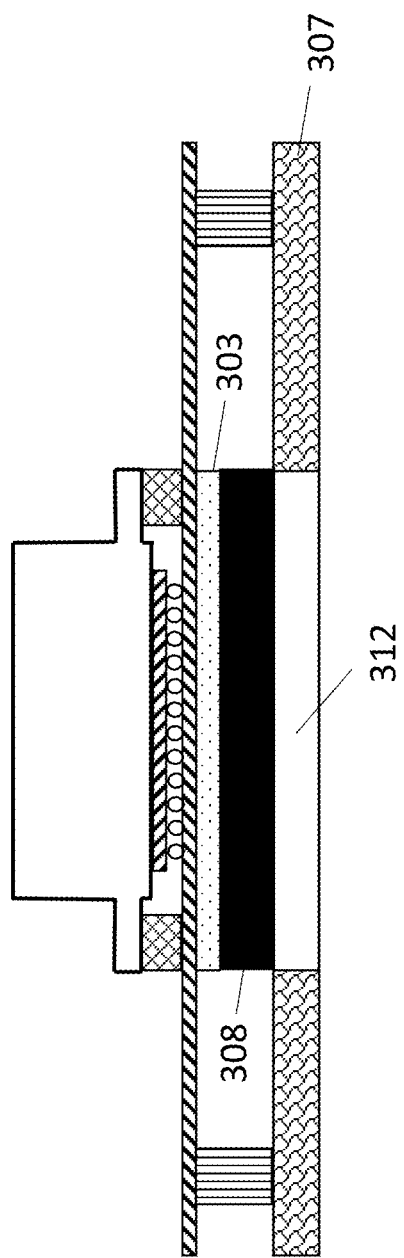

FIGS. 3*a* through 3*e* depict alternative embodiments that employ magnetic force consistent with the basic approach of FIG. 2 but that are structured differently. FIG. 3*a* shows a first alternative embodiment where the entire backplate 303 is composed of magnetic material. FIG. 3*b* shows a second alternative embodiment that adopts of the structure of FIG. 2 but additionally includes a special insert of magnetic material 312 within the chassis material 307 (the chassis material 307 is less magnetic than the insert material 312).

FIG. 3*c* shows a third alternative embodiment that adopts the structure of FIG. 3*a* but additionally includes a special insert of magnetic material 313 within the chassis material 307 (the chassis material 307 is less magnetic than the insert material 312).

FIG. 3*d* shows a fourth alternative embodiment that adopts the structure of FIG. 2 but additionally includes a layer of magnetic material 314 that resides between the backplate magnetic layer 308 and the chassis material 307 and that is fixed (e.g., bolted, screwed, riveted, etc.) to the chassis material 307.

FIG. 3*e* shows a fifth alternative embodiment that adopts the structure of FIG. 3*a* but additionally includes a layer of magnetic material 315 that resides between the backplate magnetic layer 3 and the chassis material 307 and that is fixed (e.g., bolted, screwed, riveted, etc.) to the chassis material 307.

Although embodiments above have been directed to air cooled heat sinks, the teachings above could be applied to other mass blocks that are placed in thermal contact with a semiconductor chip package IHS. Examples include liquid cooled mass blocks (also referred to as a cold plate) or the types of mass blocks that are used in immersion cooled systems. For purposes of clarity and simplicity, the term "heat sink" should be understood to also include such mass blocks.

Although embodiments above were directed to permanent magnetic materials or materials that could produce a magnetic moment in response to another material's magnetization, in other embodiments the magnetization of one or more magnetic materials could be induced electrically such as with electro-magnets. Here, for example, a coil of wire is oriented to generate a magnetic field the induces a magnetic material to generation a particular magnetic moment. When electrical current is passed through the coil, the desired magnetic moment in the material is achieved.

The discussion below pertains to systems, data centers and racks. Although described primarily in stand alone fashion, it is pertinent to point out that the teachings provided above could be applied to the thermal solution of any package of one or more semiconductor chips and/or electro-optic devices within the systems/data centers/racks discussed immediately below.

FIG. 4 depicts an example system. The system can use the teachings provided herein. System 400 includes processor 410, which provides processing, operation management, and execution of instructions for system 400. Processor 410 can include any type of microprocessor, central processing unit (CPU), graphics processing unit (GPU), processing core, or other processing hardware to provide processing for system 400, or a combination of processors. Processor 410 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 400 includes interface 412 coupled to processor 410, which can represent a higher speed interface or a high throughput interface for system components that needs higher bandwidth connections, such as memory subsystem 420 or graphics interface components 440, or accelerators 442. Interface 412 represents an interface circuit, which can be a standalone component or integrated onto a processor die. Where present, graphics interface 440 interfaces to graphics components for providing a visual display to a user of system 400. In one example, graphics interface 440 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 440 generates a display based on data stored in memory 430 or based on operations executed by processor 410 or both. In one example, graphics interface 440 generates a display based on data stored in memory 430 or based on operations executed by processor 410 or both.

Accelerators 442 can be a fixed function offload engine that can be accessed or used by a processor 410. For example, an accelerator among accelerators 442 can provide compression (DC) capability, cryptography services such as public key encryption (PKE), cipher, hash/authentication capabilities, decryption, or other capabilities or services. In some embodiments, in addition or alternatively, an accelerator among accelerators 442 provides field select controller capabilities as described herein. In some cases, accelerators 442 can be integrated into a CPU socket (e.g., a connector to a motherboard or circuit board that includes a CPU and provides an electrical interface with the CPU). For example, accelerators 442 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 442 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Any of the processors and/or accelerators mentioned above may be implemented on a silicon chip that is packaged in a package that uses magnetic forces as described above. Such processors/accelerators may be integrated on a larger system on chip (SOC) that is packaged in a package that uses magnetic forces as described above. A package that makes use of magnetic forces as described above may include multiple semiconductor chips (e.g., multiple logic chips, a logic chip and multiple memory chips, etc.) and/or opto/electronic devices (e.g., light emitting diodes (LEDs), lasers, receivers, etc.).

Memory subsystem 420 represents the main memory of system 400 and provides storage for code to be executed by processor 410, or data values to be used in executing a routine. Memory subsystem 420 can include one or more memory devices 430 such as read-only memory (ROM), flash memory, volatile memory, or a combination of such devices. Memory 430 stores and hosts, among other things, operating system (OS) 432 to provide a software platform for execution of instructions in system 400. Additionally, applications 434 can execute on the software platform of OS 432 from memory 430. Applications 434 represent programs that have their own operational logic to perform execution of one or more functions. Processes 436 represent agents or routines that provide auxiliary functions to OS 432 or one or more applications 434 or a combination. OS 432, applications 434, and processes 436 provide software logic to provide functions for system 400. In one example, memory subsystem 420 includes memory controller 422, which is a memory controller to generate and issue commands to memory 430. It will be understood that memory controller 422 could be a physical part of processor 410 or a physical part of interface 412. For example, memory controller 422 can be an integrated memory controller, integrated onto a circuit with processor 410. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 400 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 400 includes interface 414, which can be coupled to interface 412. In one example, interface 414 represents an interface circuit, which can include stand-alone components and integrated circuitry. In one example, multiple user interface components or peripheral components, or both, couple to interface 414. Network interface 450 provides system 400 the ability to communicate with remote devices (e.g., servers or other computing devices) over one or more networks. Network interface 450 can include an Ethernet adapter, wireless interconnection components, cellular network interconnection components, USB (universal serial bus), or other wired or wireless standards-based or proprietary interfaces. Network interface 450 can transmit data to a remote device, which can include sending data stored in memory. Network interface 450 can receive data from a remote device, which can include storing received data into memory. Various embodiments can be used in connection with network interface 450, processor 410, and memory subsystem 420.

In one example, system 400 includes one or more input/output (I/O) interface(s) 460. I/O interface 460 can include one or more interface components through which a user interacts with system 400 (e.g., audio, alphanumeric, tactile/touch, or other interfacing). Peripheral interface 470 can include any hardware interface not specifically mentioned above. Peripherals refer generally to devices that connect dependently to system 400. A dependent connection is one where system 400 provides the software platform or hardware platform or both on which operation executes, and with which a user interacts.

In one example, system 400 includes storage subsystem 480 to store data in a nonvolatile manner. In one example, in certain system implementations, at least certain components of storage 480 can overlap with components of memory subsystem 420. Storage subsystem 480 includes storage device(s) 484, which can be or include any conventional medium for storing large amounts of data in a non-volatile manner, such as one or more magnetic, solid state, or optical based disks, or a combination. Storage 484 holds code or instructions and data in a persistent state (e.g., the value is retained despite interruption of power to system 400). Storage 484 can be generically considered to be a "memory," although memory 430 is typically the executing or operating memory to provide instructions to processor 410. Whereas storage 484 is nonvolatile, memory 430 can include volatile memory (e.g., the value or state of the data is indeterminate if power is interrupted to system 400). In one example, storage subsystem 480 includes controller 482 to interface with storage 484. In one example controller 482 is a physical part of interface 414 or processor 410 or can include circuits or logic in both processor 410 and interface 414.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 400. More specifically, power source typically interfaces to one or multiple power supplies in system 400 to provide power to the components of system 400. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 400 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 5 depicts an example of a data center. Various embodiments can be used in or with the data center of FIG. 5. As shown in FIG. 5, data center 500 may include an optical fabric 512. Optical fabric 512 may generally include a combination of optical signaling media (such as optical cabling) and optical switching infrastructure via which any particular sled in data center 500 can send signals to (and receive signals from) the other sleds in data center 500. However, optical, wireless, and/or electrical signals can be transmitted using fabric 512. The signaling connectivity that optical fabric 512 provides to any given sled may include connectivity both to other sleds in a same rack and sleds in other racks.

Data center 500 includes four racks 502A to 502D and racks 502A to 502D house respective pairs of sleds 504A-1 and 504A-2, 504B-1 and 504B-2, 504C-1 and 504C-2, and 504D-1 and 504D-2. Thus, in this example, data center 500 includes a total of eight sleds. Optical fabric 512 can provide sled signaling connectivity with one or more of the seven other sleds. For example, via optical fabric 512, sled 504A-1 in rack 502A may possess signaling connectivity with sled 504A-2 in rack 502A, as well as the six other sleds 504B-1, 504B-2, 504C-1, 504C-2, 504D-1, and 504D-2 that are distributed among the other racks 502B, 502C, and 502D of data center 500. The embodiments are not limited to this example. For example, fabric 512 can provide optical and/or electrical signaling.

FIG. 6 depicts an environment 600 includes multiple computing racks 602, each including a Top of Rack (ToR) switch 604, a pod manager 606, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 608, and INTEL® ATOM™ pooled compute drawer 610, a pooled storage drawer 612, a pooled memory drawer 614, and a pooled I/O drawer 616. Each of the pooled system drawers is connected to ToR switch 604 via a high-speed link 618, such as a 40 Gigabit/second (Gb/s) or 100 Gb/s Ethernet link or an 100+Gb/s Silicon Photonics (SiPh) optical link. In one embodiment high-speed link 618 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 600 may be interconnected via their ToR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations.

RSD environment 600 further includes a management interface 622 that is used to manage various aspects of the RSD environment. This includes managing rack configuration, with corresponding parameters stored as rack configuration data 624.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a heat sink;
a printed circuit board having a first side and a second side wherein the first side is opposite the second side;
a semiconductor chip package;
a first magnetic material, wherein the first magnetic material is mechanically coupled to the first side of the printed circuit board, wherein input/outputs (I/Os) of said semiconductor chip package interface with said printed circuit board; and
a second magnetic material wherein said heat sink, said printed circuit board, said first magnetic material, and said second magnetic material are in a stacked configuration, wherein said first magnetic material is sandwiched between said printed circuit board and said second magnetic material in said stacked configuration, and wherein said first magnetic material is magnetically attracted to said second magnetic material.

2. The apparatus of claim 1 wherein said first magnetic material is a layer of magnetic material that is affixed to a backplate that is to be mounted to said first side of said printed circuit board.

3. The apparatus of claim 2 wherein said second magnetic material is part of a system chassis that said printed circuit board is to be integrated within.

4. The apparatus of claim 2 wherein said second magnetic material is an insert that is to be inserted into a corresponding space of a system chassis.

5. The apparatus of claim 2 wherein said second material is to be affixed to a system chassis that said printed circuit board is to be integrated within.

6. The apparatus of claim 1 wherein a backplate that is to be mounted to said second side of said printed circuit board is comprised of said first magnetic material.

7. The apparatus of claim 6 wherein a system chassis that said printed circuit board is to be integrated within comprises said second magnetic material.

8. The apparatus of claim 6 wherein said second magnetic material is an insert that is to be inserted into a corresponding space of a system chassis.

9. The apparatus of claim 6 wherein said second magnetic material is to be affixed to a system chassis that said printed circuit board is to be integrated within.

10. A system, comprising:
a chassis;

a printed circuit board that is mechanically attached to the chassis;

a semiconductor chip package having I/Os that interface with a first side of the printed circuit board;

a heat sink that is thermally coupled to the semiconductor chip package; and a first magnetic material and a second magnetic material, wherein the first magnetic material is mechanically coupled to a second side of the printed circuit board, wherein the first magnetic material is between the printed circuit board and the second magnetic material, wherein the semiconductor chip package is between the heat sink and the second magnetic material, and wherein the first magnetic material is magnetically attracted to the second magnetic material to.

11. The system of claim 10 wherein said first magnetic material is a layer of magnetic material that is affixed to a backplate that is to be mounted to said second side of said printed circuit board.

12. The system of claim 11 wherein said second magnetic material is part of a system chassis that said printed circuit board is to be integrated within.

13. The system of claim 11 wherein said second magnetic material is an insert that is to be inserted into a corresponding space of a system chassis.

14. The system of claim 11 wherein said second material is to be affixed to a system chassis that said printed circuit board is to be integrated within.

15. The system of claim 10 wherein a backplate that is to be mounted to said second side of said printed circuit board is comprised of said first magnetic material.

16. The system of claim 15 wherein a system chassis that said printed circuit board is to be integrated within comprises said second magnetic material.

17. The system of claim 15 wherein said second magnetic material is an insert that is to be inserted into a corresponding space of a system chassis.

18. The system of claim 15 wherein said second material is to be affixed to a system chassis that said printed circuit board is to be integrated within.

19. A method, comprising:

attaching a semiconductor chip package to a heat sink and a backplate comprising a magnetic material to create a loading assembly wherein the heat sink and the magnetic material are on opposite sides of the semiconductor chip package; and mechanically integrating the loading assembly to a system chassis, wherein mechanically integrating comprises placing the backplate of the loading assembly such that it faces a second magnetic material that is integrated with the system chassis, such that the first and second magnetic materials are attracted to one another.

20. The method of claim 19 wherein the system chassis is comprised of steel, the steel is comprised of iron and the second magnetic material is the iron.

* * * * *